United States Patent
Schelle et al.

(10) Patent No.: US 9,678,150 B2
(45) Date of Patent: Jun. 13, 2017

(54) METHODS AND CIRCUITS FOR DEBUGGING CIRCUIT DESIGNS

(71) Applicant: Xilinx, Inc., San Jose, CA (US)

(72) Inventors: Graham F. Schelle, Longmont, CO (US); Yi-Hua E. Yang, San Jose, CA (US); Philip B. James-Roxby, Longmont, CO (US); Paul R. Schumacher, Berthoud, CO (US); Patrick Lysaght, Los Gatos, CA (US)

(73) Assignee: XILINX, INC., San Jose, CA (US)

( * ) Notice: Subject to any disclaimer, the term of this patent is extended or adjusted under 35 U.S.C. 154(b) by 0 days.

(21) Appl. No.: 14/924,090

(22) Filed: Oct. 27, 2015

(65) Prior Publication Data

US 2017/0115348 A1    Apr. 27, 2017

(51) Int. Cl.
G06F 11/22    (2006.01)
G06F 17/50    (2006.01)
G01R 31/317   (2006.01)
G01R 31/3177  (2006.01)

(52) U.S. Cl.
CPC ... G01R 31/31703 (2013.01); G01R 31/3177 (2013.01)

(58) Field of Classification Search
CPC .............................................. G01R 31/31703
USPC ........................................................... 716/136
See application file for complete search history.

(56) References Cited

U.S. PATENT DOCUMENTS

2011/0289373 A1* 11/2011 Klein ............ G06F 17/5022
                                            714/741
2014/0005999 A1* 1/2014 Agarwala ........ G06F 17/5022
                                            703/14

OTHER PUBLICATIONS

Specification and drawings for U.S. Appl. No. 14/312,616, filed Jun. 23, 2014, Yang et al.

* cited by examiner

Primary Examiner — Suresh Memula
(74) Attorney, Agent, or Firm — LeRoy D. Maunu

(57) ABSTRACT

Various example implementations are directed to circuits and methods for debugging circuit designs. According to an example implementation, waveform data is captured, for a set of signals produced by a circuit design during operation. Data structures are generated for the set of signals and waveform data for the signals is stored in the data structures. Communication channels associated with the set of signals are identified. Waveform data stored in the data structures is analyzed to locate transaction-level events in the set of signal for one or more communication channels. Data indicating locations of the set of transaction-level events is output by the computer system.

20 Claims, 6 Drawing Sheets

METHODS AND CIRCUITS FOR DEBUGGING CIRCUIT DESIGNS

TECHNICAL FIELD

The disclosure generally relates to testing logic circuits, and more particularly to debugging circuit designs.

BACKGROUND

Programmable integrated circuits (ICs) may be programmed by a user to perform specified logic functions. One type of programmable IC, known as a field programmable gate array (FPGA), typically includes programmable resources that are arranged in an array of programmable tiles having programmable interconnects and programmable logic. The programmable interconnect typically includes a large number of interconnect lines of varying lengths interconnected by programmable interconnect points (PIPs). The programmable logic implements the logic of a circuit design using programmable elements that can include, for example, function generators, registers, arithmetic logic, and so forth. The programmable interconnect and programmable logic are typically programmed by loading a stream of configuration data into internal configuration memory cells that define how the programmable elements are configured. The configuration data can be read from memory (e.g., from an external PROM) or written into the FPGA by an external device. The collective states of the individual memory cells then determine the function of the FPGA.

During the process of developing a circuit design, the circuit design is generally tested to assess operation and performance prior to physical implementation and deployment. Testing of a circuit design may entail observing operation of circuit modules in an application specific integrated circuit (ASIC) implementation of the circuit design, simulating the circuit modules using a software-based simulation model, or emulating the circuit modules on a programmable IC. In emulating a circuit design, programmable resources on a programmable IC are configured to implement the circuit design. In some implementations, operation of a circuit design may be modeled using a combination of simulation, emulation, and/or operation of ASIC implemented circuit modules. As one example, a first circuit module of a circuit design may be simulated concurrently with emulation of a second circuit module of the circuit design. During testing, test data is provided to a simulated/emulated/ASIC-implemented circuit modules of the circuit design and data signals are captured from various nodes of the circuit design. Data signals may be input to and captured from a simulated circuit design by a software debugging tool configured to execute a simulation model of the circuit design. Data may be input to and captured from a circuit design emulated on a programmable IC or implemented as an ASIC using various circuits including, for example, an integrated logic analyzer circuit included in or connected to the programmable IC or ASIC die.

SUMMARY

Various example implementations are directed to debugging circuit designs. According to an example implementation, a method for debugging circuit designs is disclosed. Waveform data is captured for a set of signals produced by a circuit design during operation. Respective data structures are generated for the set of signals and waveform data for the signals is stored in the data structures. Communication channels implemented by the set of signals are identified. Waveform data stored in the data structures is analyzed to locate transaction-level events in the set of signal for one or more communication channels. Data indicating locations of the set of transaction-level events is output.

According to an example implementation, an apparatus is disclosed for debugging circuit designs. The apparatus includes a computing arrangement including one or more processor circuits and a memory circuit coupled to the processor circuits. A set of instructions are stored in the memory circuit. When executed by the processor circuits, the instructions configure the processor circuit to capture waveform data for a set of signals produced by a circuit design during operation and store the waveform data in the memory. The processor circuits are further configured to generate respective data structures for the set of signals from the waveform data. The processor circuits are also configured to identify communication channels implemented by the set of signals. For each of the communication channels, the processor circuits identify a set of transaction-level events for the communication channel based on the data structures. The processor circuits are configured to store data indicative of the set of transaction-level events in the memory circuit.

Other features will be recognized from consideration of the Detailed Description and Claims, which follow.

BRIEF DESCRIPTION OF THE DRAWINGS

Various aspects and features of the disclosed methods and circuit will become apparent upon review of the following detailed description and upon reference to the drawings in which.

DETAILED DESCRIPTION

Figure 1:
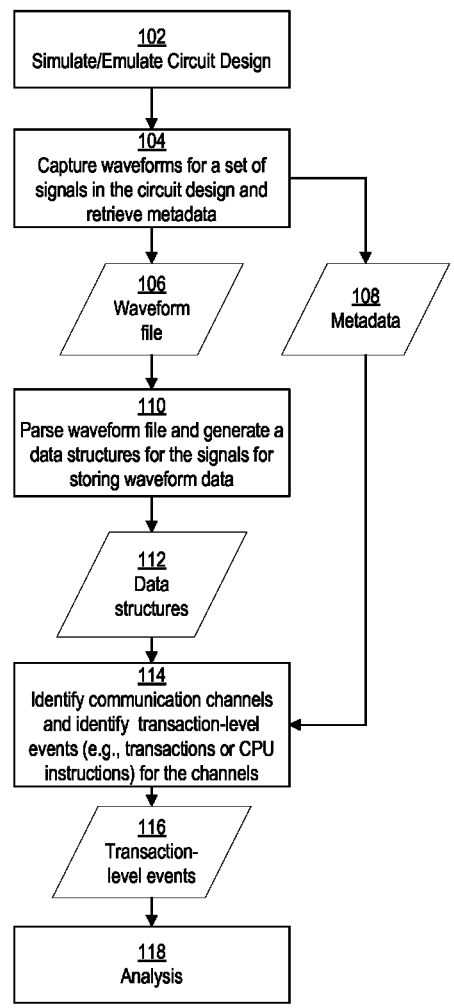
FIG. 1 shows an example process for debugging a circuit design.

In the following description, numerous specific details are set forth to describe specific examples presented herein. It should be apparent, however, to one skilled in the art, that one or more other examples and/or variations of these examples may be practiced without all the specific details given below. In other instances, well known features have not been described in detail so as not to obscure the description of the examples herein.

Debugging is an integral part of developing circuit designs. Debugging a circuit design to be implemented on a programmable IC typically involves testing operation of the programmable IC via simulation and/or emulation of the circuit design. One difficulty in debugging circuit designs involves debugging operation of communication channels/interfaces to ensure that the operation complies with all requirements of a protocol used by a communication channel or interface, for example. Some communication protocols used a large number of data and control signals to implement a communication channel. For example, an Advanced Extensible Interface (AXI) channel is formed by various clock and reset signals, write address signals, write data signals, write response signals, read address signals, read data signals, and/or low power interface signals. Currently, developers visually inspect waveforms of sampled data signals to manually identify communication channels and transaction-level events (e.g., data transactions or processor instructions) performed on each communication channel to evaluate high-level operation and/or determine if protocol violations have occurred. Similarly, developers must visually inspect a waveform to assess performance of a circuit design. Visual inspection of waveforms becomes increasingly difficult as the number of transactions increases.

Methods and apparatuses are disclosed for debugging of a circuit design at a transaction-level. Waveforms are captured for a set of signals produced by the circuit design during operation of the circuit design. The set of signals may be generated, for example, by simulating the circuit design in a software-based simulation model and/or emulating the circuit design on a programmable IC. A waveform for a data signal may be captured by sampling one or more analog characteristics (e.g., voltage, phase, or amplitude) of the data signal at sequential moments in time. For each signal of the set of signals, a respective data structure is generated and waveform data for the signal is stored in the data structure. Communication channels implemented by the set of signals are identified. Waveform data stored in the data structures is analyzed to locate transaction-level events in the data signals for one or more communication channels. Transaction-level events may include, for example, individual data transactions on a communication channel, individual instructions executed by a processor circuit or hardware accelerated function implemented in programmable logic. Data indicating locations of the set of transaction-level events is output.

Transaction-level events for a communication channel may be located using various analytical processes. In some implementations, protocols implemented by the communication channels are first identified. Protocols may include, but are not limited to, AXI, Peripheral Component Interconnect Express (PCIe), Universal Serial Bus (USB), IEEE1394, and/or Serial Attached SCSI. Protocols may be identified, for example, based on metadata included in the circuit design, names of signals in the circuit design, user input, or combinations thereof. For each of the identified protocols, a respective application program interface (API) is provided. Each API is configured to identify transaction-level events for the protocol from the data structures. An API for a communication protocol may be provided, for example, by retrieving the API from an API library. For each of the communication channels that implement the protocol, the API is executed to locate transaction-level events in the data signals for the communication channel.

In some implementations, a debugging tool is configured to identify the transaction-level events from a set of captured data signals. The debugging tool may be configured, for example, to generate and display graphical representations of waveforms with visual markers identifying the transaction-level events in the waveforms, for visual inspection and/or analysis by a user via a graphical user interface (GUI) window. Illustration of transaction-level events may assist visual inspection of waveforms by a user. For example, visual markers may be added to waveforms for a communication channel to identify start and endpoints of data transactions communicated via the communication channel.

As another example, the debugging tool may trace a data transaction across multiple linked communication channels, which implement different protocols. For ease of reference, data transactions that are communicated across communication channels implementing different protocols may be referred to as a heterogeneous transaction. In some implementations, the debugging tool graphically identifies a heterogeneous transaction in the displayed graphical representations of the waveforms. For instance, the debugging tool may highlight all portions of the displayed waveforms corresponding to a heterogeneous transaction selected by a user. Heterogeneous transactions may be traced using various processes. In some implementations, heterogeneous transactions may be traced based on metadata in a circuit design, for example, indicating interface connections between different data channels.

In some implementations, the debugging tool may be configured to analyze transaction-level events to assess operation of the circuit design. For example, the debugging tool may be configured to evaluate one or more of the captured data signals for compliance with one or more communication protocols. In some implementations, the debugging tool may also generate and display, via a GUI window, graphical indications of protocol violations for one or more circuit modules or captured data signals. For instance, graphical representations of the captured data signals that are displayed may be supplemented with visual markers that identify locations and type of detected protocol violations.

Additionally or alternatively, the debugging tool may be configured to analyze the transaction-level events and/or data structures to assess various performance metrics of a circuit design. Performance metrics may include for example, latency, timing slack, power consumption, signal jitter, clock jitter, throughput, byte count, beat count, idle cycles, size of data transfers, or combinations thereof.

In some implementations, the debugging tool is configured to analyze the captured data signals to assess various performance metrics for one or more of the circuit modules. Performance metrics may include for example, throughput, latency, timing slack, power consumption, signal jitter, clock jitter, throughput, byte count, beat count, idle cycles, size of data transfers, instructions per second, instructions per cycle, cache misses, or combinations thereof. In some implementations, the debugging tool may further determine minimum values, maximum values, average values, and/or rate of change for one or more of the performance metrics in a specified time period. The debugging tool may be configured to display performance metrics for a communication channel alongside graphical representations of waveforms for the channel in a GUI window.

In some implementations, the debugging tool provides an extensible API for searching the transaction-level events. The API is extensible in that it can be adapted by a user to perform customized query of the transaction-level events in addition to a set of predefined searches. In some implementations, the debugging tool provides a GUI window for a user to configure the extensible API for customized query of transaction-level events. A customized query of transaction-level events may allow a user to easily search transaction-level events for scenarios that are of particular interest to the circuit design under test. As an illustrative example, for a circuit design that implements triple modular redundancy (TMR) circuits, a designer may wish to identify transactions for which redundant circuits produce different results. The debugging tool may be configured to highlight portions of the waveforms corresponding to transaction-level events matching a query input via the GUI window.

In some implementations, a debugging tool may be configured to identify transactions for one or more higher-layer protocols from the identified transaction-level events. For example, a number of individual data transactions for a lower-layer protocol may correspond to a larger data transaction performed by a higher-layer protocol. For instance, transaction-level events may be grouped into subsets of transaction-level events, for example, corresponding to, Ethernet packets, frames of a video stream, and/or a CPU call stack.

Waveform data may be captured for various signals generated during operation of a circuit design under test using various hardware or software based monitoring interfaces. Monitoring interfaces may include, for example, a software process implemented by a debugging tool, or a monitoring circuit (e.g., an integrated logic analyzer) included in a programmable IC used to emulate the circuit design. In some implementations, a monitoring circuit may be a hardwired circuit implemented in or coupled to a programmable IC. In some other implementations, a monitoring circuit may be instantiated in a circuit design and implemented in programmable resources of a programmable IC along with one or more circuit modules that are being emulated.

Some programmable ICs may include a processor coupled to a set of programmable resources. The programmable resources may be configured to implement a hardware portion of a circuit design and the processor may be configured to implement a software portion of a circuit design. In some implementations, the processor may be programmed to capture waveform data for a set of signals of the circuit design.

Turning now to the figures, FIG. 1 shows an example process for debugging a circuit design. At block 102, operation of the circuit design is simulated and/or emulated. During simulation/emulation, waveforms for a set of data signals generated at various nodes of the circuit design are captured at block 104 and stored in a waveform file 106. In some implementations, metadata 108 may also be retrieved at block 104. The metadata 108 may specify for example various characteristics of the data signals or circuit modules of the circuits design. Metadata may be acquired, for example, based on naming conventions of signals and/or circuit modules, net connections between circuit modules, and/or configuration settings for circuit modules in the circuit design. At block 110, the waveform file is parsed and data structures are generated for storing respective waveform data for each of the set of data signals. At block 114, communication channels are identified. Transaction-level events 116 are also identified at block 114 for each communication channel based on the data structures 112, the metadata 108, or combinations thereof. Identification of communication channels and transaction-level events is discussed in more detail with reference to FIG. 2. At block 118, transaction-level events are analyzed to assess performance and or operation of the circuit design at the transaction-level. As previously described, analysis may include, for example, identifying protocol violations, tracing heterogeneous transactions, evaluating one or more performance metrics, or performing user specified query of the transaction-level events 116.

Figure 2:
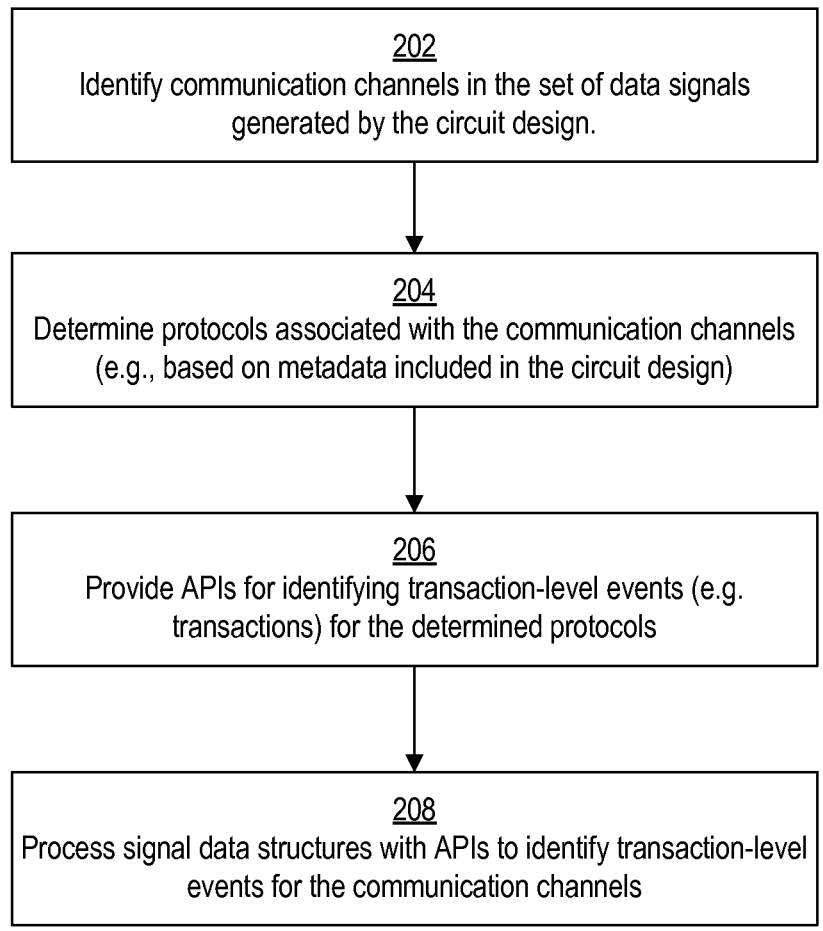
FIG. 2 shows an example process for identifying transaction-level events.

FIG. 2 shows an example process for identifying transaction-level events. At block 202, communication channels are identified in the set of data signals generated by the circuit design. At block 204, protocols associated with the communication channels are identified. Communication channels and/or protocols may be identified, for example, based on metadata included in the circuit design. For instance, naming of the data signals and hierarchy of a circuit design may identify communication channels and indicate which communication protocol is implemented by the communication channel. Alternatively, in some implementations, communication channels and/or protocols may be identified without metadata from the circuit design. For instance, channel naming and hierarchy of a circuit design may be inferred from a set of captured waveforms, for example, using pattern matching and/or causation analysis.

For each of the identified protocols, a respective API is provided at block 206. The API is configured to identify transaction-level events for the particular protocol from the data structures. As an illustrative example, data transactions of an AXI communication channel may be identified based on values of AXI signals VALID, READY, RLAST, and WLAST. For instance, the start position of an AXI data transaction can be identified by the assertion of a VALID or READY signal. The end position of an AXI read transaction can be identified by an RLAST signal being asserted and cleared. The end position of an AXI write transaction can be identified by a WLAST signal being asserted followed by a BRESP being asserted. APIs for the communication protocols may be provided, for example, from an API library having respective APIs for a plurality of communication protocols. At block 208, the data structures are processed using the provided API to determine transaction-level events for the identified communication channels.

Figure 3:
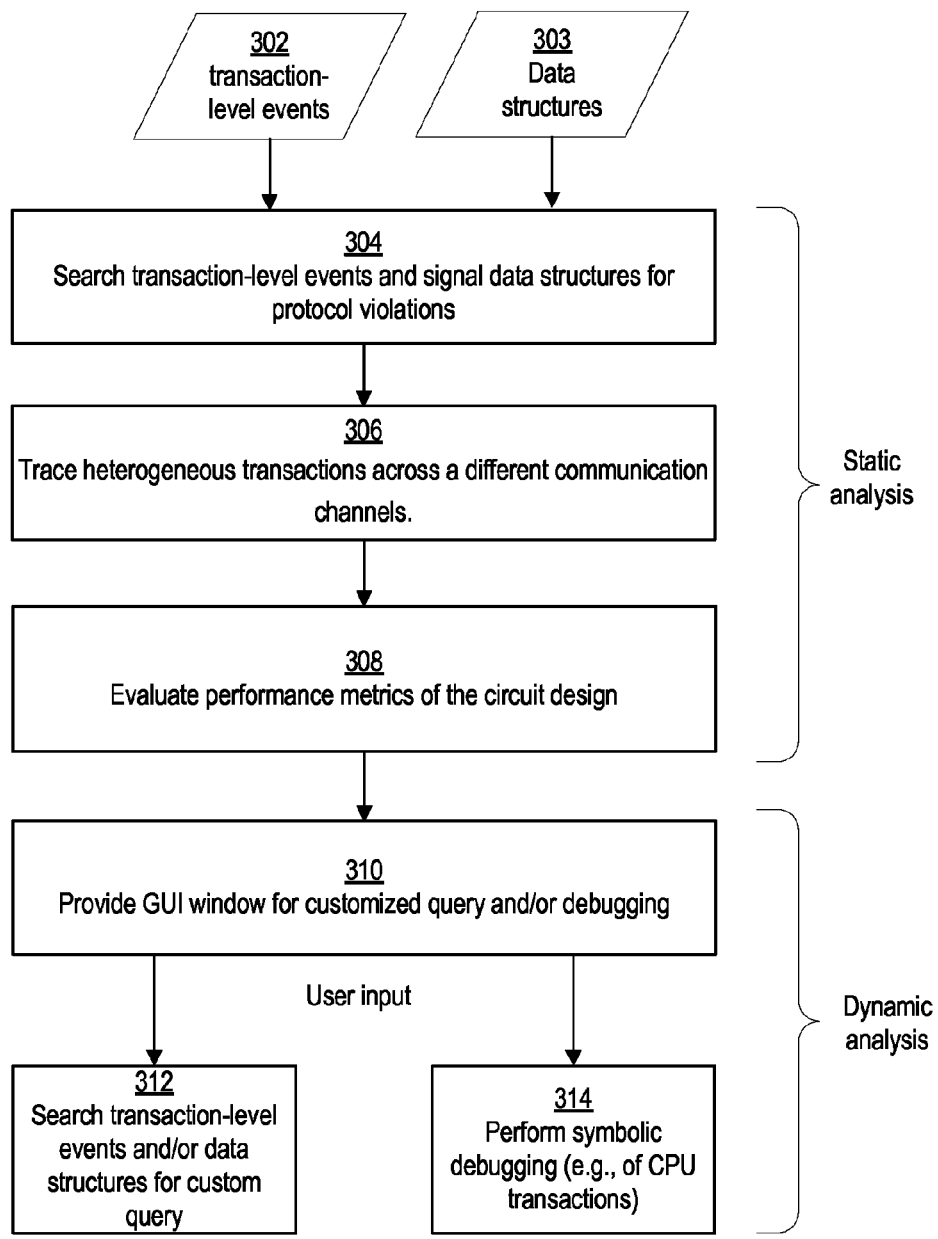
FIG. 3 shows an example process for analysis of a circuit design based on identified transaction-level events.

FIG. 3 shows an example process for analysis of a circuit design based on identified transaction-level events. As previously discussed, transaction-level events and/or signal data structures may be analyzed to assess performance and/or operation of a circuit design. In this example, analysis includes a number of static analysis processes, which can be performed automatically at blocks 304, 306, and 308 without interaction by a user.

At block 304, the transaction-level events 302 and/or waveform data in the signal data structures 303 are searched to detect violations of one or more communication protocols. The manner in which protocol violations may be detected depends on requirements/limitations of data transactions specified by each communication protocol. As one example, the AXI protocol requires the length of a fixed burst mode transaction to be no more than 16 beats. As another example of an AXI violation, ARADDR, ARBURST, ARCACHE, ARID, ARLEN, ARLOCK, ARPROT, ARSIZE, ARQOS, and ARREGION signals must remain stable when an ARVALID signal is asserted and an ARREADY signal is low. In some implementations, criteria for detecting violations of a particular communication protocol may be retrieved, for example, from a library having respective sets of testing criteria for a plurality of communication protocols.

At block 306, heterogeneous transactions are traced across different communication channels. As previously indicated, heterogeneous transactions may be traced using various processes. In some implementations, heterogeneous transactions may be traced based on metadata in a circuit design, for example, indicating interface connections between different communication channels. In some other implementations, naming conventions of two communication channels may indicate that the two communication channels are linked.

At block 308, performance metrics of the circuit design are evaluated. As previously indicated performance metrics may include for example, throughput, latency, timing slack, power consumption, signal jitter, clock jitter, throughput, byte count, beat count, idle cycles, size of data transfers, instructions per second, instructions per cycle, cache misses or various combinations thereof. Performance may be evaluated for individual transactions, individual communication channels, and/or individual circuit modules in a circuit design. Additionally or alternatively, a performance metric may evaluate performance for a combination of transactions, communication channels, and/or circuit modules. For example, one performance metric may analyze throughput of a heterogeneous transaction for multiple communication channels used for the transaction to determine which communication channel is limiting the overall throughput of the transaction.

In this example, dynamic analysis is also performed at blocks 310, 312, and 314. Dynamic analysis is configured dynamically in real-time in response to user input—thereby allowing user customized analysis to be performed. At block 310, a GUI window is provided. The GUI window may be configured to display simulation data and/or analysis results for visual inspection and/or debugging by a user. For instance, as previously discussed, a GUI window of a debugging tool may be configured to display graphical representations of captured waveforms, performance metrics, protocol violations, and/or identified heterogeneous transactions. Additionally, the GUI window includes an input and display interface for customized query and/or debugging by a user. In response to user input, via the GUI, the process performs operations requested by the user input, for example, at blocks 312 and 314. In this example, transaction-level events and/or signal data structures are searched at block 312 for a customized search query specified for a user. Portions of waveforms matching the search query may be displayed in the GUI window provided at block 310. As previously discussed, user customized query of transaction-level events and/or signal data structures may allow a user to easily identify portions of waveforms corresponding to a scenario that is relevant only in the context of the circuit design under test. In this example, symbolic debugging is also conducted at block 314 responsive to the user input. A symbolic debugger may identify for example, data transactions initiated in response to execution of individual HLL instructions by a processor included in the circuit design.

Figure 4:
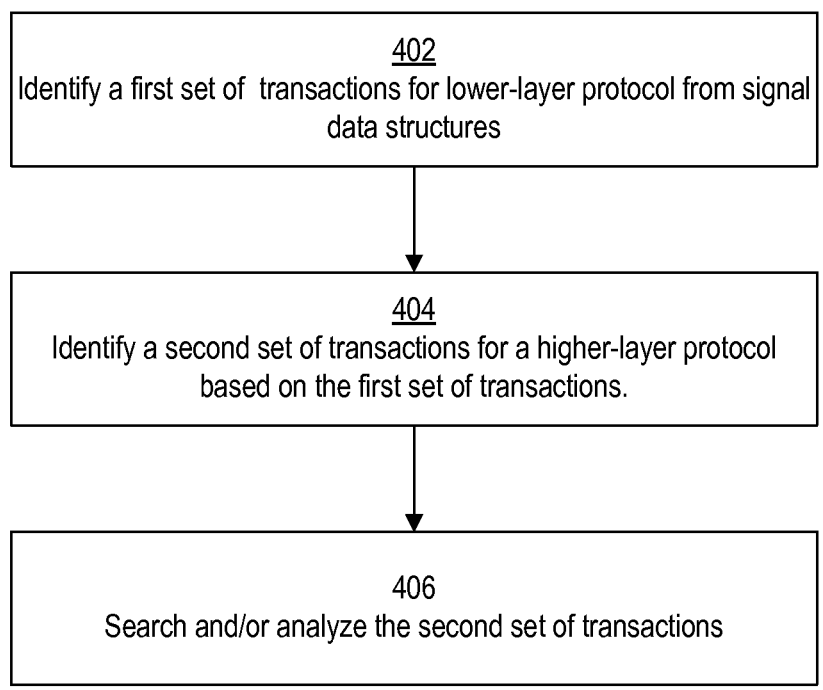
FIG. 4 shows an example process for identifying transactions for multiple protocol layers.

In some implementations, transactions may be identified for multiple layers of communication protocols including, for example, communication protocols used to implement abstraction layers in the open system interconnection (OSI) model. FIG. 4 shows an example process for identifying transactions for multiple layers of protocols. At block 402, a first set of transactions are identified for a lower-layer protocol based on the data structures, for example, as discussed with reference to FIG. 2. At block 404, a second set of transactions may be identified for a higher-layer protocol based on the first set of transactions. For example, a transaction of the higher-layer protocol may be performed using multiple ones of the first set of transactions for the lower-layer protocol. Transactions for the higher-layer protocol may be identified by generating an API for the protocol in a similar manner to that discussed with reference to FIG. 2. At block 406, the second set of transactions is analyzed. The second set of transactions may be analyzed as discussed with reference to analysis of transaction-level events in FIG. 3. This process may be repeated to identify transactions for even higher layer protocols based on, for example, the second set of transactions.

Figure 5:
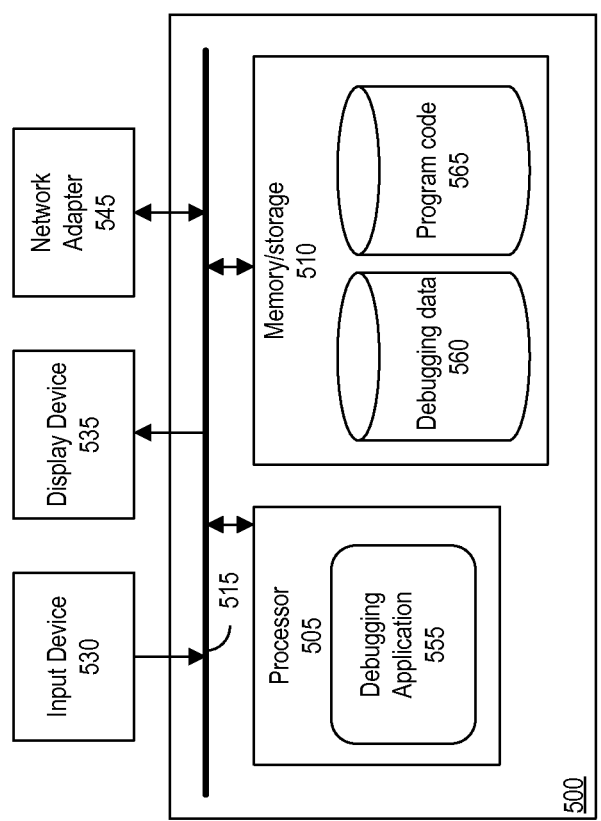
FIG. 5 shows an example computing device configured to provide a debugging tool in accordance with one or more embodiments.

FIG. 5 shows an example computer system configured to provide a debugging tool in accordance with one or more embodiments. In this example, the computer system 500 includes an arrangement of one or more processors 505, a memory/storage arrangement 510, an input device 530, a display device 535, and a network adapter 545, all coupled to a host bus 515. The arrangement 500 may be implemented with separate components on a circuit board or may be implemented internally within an integrated circuit. When implemented internally within an integrated circuit, the processor computing device is otherwise known as a microcontroller.

The architecture of the computer system 500 depends on implementation requirements as would be recognized by those skilled in the art. The processor(s) 505 may be one or more general purpose processors, or a combination of one or more general purpose processors and suitable co-processors, or one or more specialized processors (e.g., RISC, CISC, pipelined, etc.). The memory/storage arrangement 510 typically includes multiple levels of cache memory, and a main memory. The memory/storage arrangement 510 may include local and/or remote persistent storage, such as provided by magnetic disks (not shown), flash, EPROM, or other non-volatile data storage.

The memory/storage device 510 includes program code 565, which implements a debugging application 555, as discussed above, when executed by the processor(s) 505. The program code 565 may be stored and provided via a variety of computer-readable storage media or delivery channels such as magnetic or optical disks or tapes, electronic storage devices, or as application services over a network coupled to network adapter 545. During operation, the debugging application 555 stores debugging data 560 (e.g., waveform data, data structures, and/or transaction-level events) in the memory/storage device 510. A GUI window, as described above for debugging may be provided via display device 535.

Those skilled in the art will appreciate that various alternative computing arrangements, including one or more processors and a memory arrangement configured with program code, would be suitable for hosting the processes and data structures disclosed herein. In addition, the processes may be provided via a variety of computer-readable storage media or delivery channels such as magnetic or optical disks or tapes, electronic storage devices, or as application services over a network.

Figure 6:
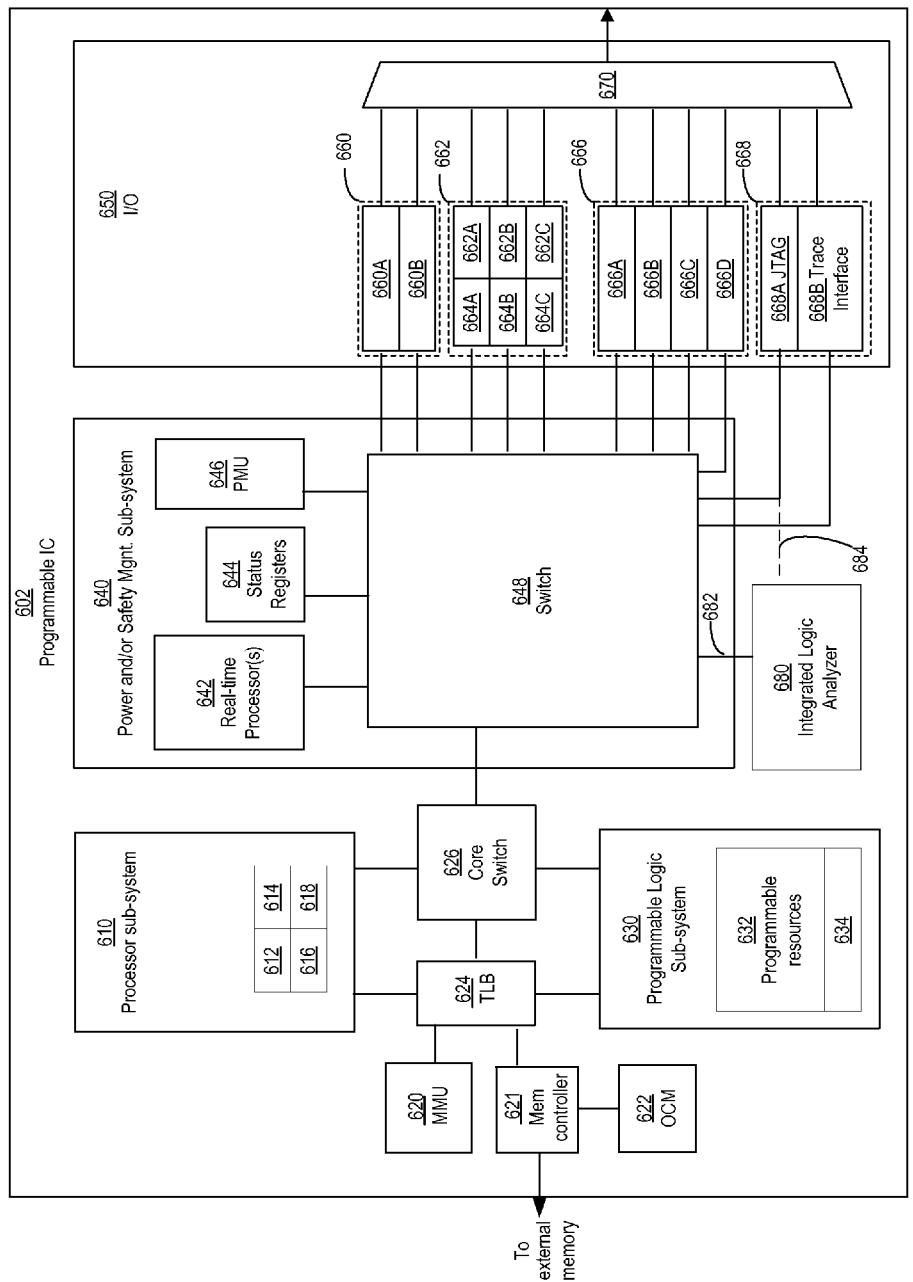
FIG. 6 shows an example programmable IC having an integrated logic analyzer circuit, in accordance with one or more implementations.

FIG. 6 shows an example programmable IC having an integrated logic analyzer circuit, in accordance with one or more implementations. The programmable IC may also be referred to as a System On Chip (SOC), which includes a processor sub-system 610 and a programmable logic sub-system 630. In this example, the programmable IC also includes a sub-system 640 having various circuits for power and/or safety management and an input/output (I/O) sub-system 650 for communication of data with external circuits. The subsystems 610, 630, 640, and 650 may be formed using a plurality of semiconductor dies, and interconnected in an IC package as described in the above examples.

The processing sub-system 610 may be programmed to implement a software portion of the circuit design, via execution of a user program. Alternatively or additionally, the program may implement one or more traffic generators configured to generate data signals to one or more ports of a partial circuit design implemented in programmable resources 632. The program may be specified as part of a configuration data stream or may be retrieved from an on-chip or off-chip data storage device. The processing sub-system 610 may include various circuits 612, 614, 616, and 618 for executing one or more software programs. The circuits 612, 614, 616, and 618 may include, for example, one or more processor cores, floating point units (FPUs), an interrupt processing unit, on chip-memory, memory caches, and/or cache coherent interconnect.

The programmable logic sub-system 630 of the programmable IC 602 may be programmed to implement a partial circuit design and traffic generation circuits as previously discussed. For instance, the programmable logic sub-system may include a number of programmable resources 632, which may be programmed to implement a set of circuits specified in a configuration data stream. The programmable resources 632 include programmable interconnect circuits, programmable logic circuits, and configuration memory cells. The programmable logic implements the logic of a circuit design using programmable elements that can include, for example, function generators, registers, arithmetic logic, and so forth. Programmable interconnect circuits may include a large number of interconnect lines of varying lengths interconnected by programmable interconnect points (PIPs).

The programmable resources 632 may be programmed by loading a configuration data stream into the configuration memory cells, which define how the programmable interconnect circuits and programmable logic circuits are configured. The collective states of the individual memory cells then determine the function of the programmable resources 632. The configuration data can be read from memory (e.g., from an external PROM) or written into the programmable IC 602 by an external device. In some implementations, configuration data may be loaded into configuration memory cells by a configuration controller 634 included in the programmable logic sub-system 630. In some other implementations, the configuration data may be loaded into the configuration memory cells by a start-up process executed by the processor sub-system 610.

The programmable IC 602 may include various circuits to interconnect the processing sub-system 610 with circuitry implemented within the programmable logic sub-system 630. In this example, the programmable IC 602 includes a core switch 626 that can route data signals between various data ports of the processing sub-system 610 and the programmable logic sub-system 630. The core switch 626 may also route data signals between either of the programmable logic or processing sub-systems 610 and 630 and various other circuits of the programmable IC, such as an internal data bus. Alternatively or additionally, the processing sub-system 610 may include an interface to directly connect with the programmable logic sub-system—bypassing the core switch 626. Such an interface may be implemented, for example, using the AMBA AXI Protocol Specification (AXI) as published by ARM.

In some implementations, the processing sub-system 610 and the programmable logic sub-system 630 may also read or write to memory locations of an on-chip memory 622 or off-chip memory (not shown) via memory controller 621. The memory controller 621 can be implemented to communicate with one or more different types of memory circuits including, but not limited to, Dual Data Rate (DDR) 2, DDR3, Low Power (LP) DDR2 types of memory, whether 16-bit, 32-bit, 16-bit with ECC, etc. The list of different memory types with which memory controller 621 is able to communicate is provided for purposes of illustration only and is not intended as a limitation or to be exhaustive. As shown in FIG. 6, the programmable IC 602 may include a memory management unit 620 and translation look-aside buffer 624 to translate virtual memory addresses used by the sub-systems 610 and 630 to physical memory addresses used by the memory controller 621 to access specific memory locations.

In this example, the programmable IC includes an I/O sub-system 650 for communication of data with external circuits. The I/O sub-system 650 may include various types of I/O devices or interfaces including for example, flash memory type I/O devices, higher performance I/O devices, lower performance interfaces, debugging I/O devices, and/or RAM I/O devices.

The I/O sub-system 650 may include one or more flash memory interfaces 660 illustrated as 660A and 660B. For example, one or more of flash memory interfaces 660 can be implemented as a Quad-Serial Peripheral Interface (QSPI) configured for 4-bit communication. One or more of flash memory interfaces 660 can be implemented as a parallel 8-bit NOR/SRAM type of interface. One or more of flash memory interfaces 660 can be implemented as a NAND interface configured for 8-bit and/or 16-bit communication. It should be appreciated that the particular interfaces described are provided for purposes of illustration and not limitation. Other interfaces having different bit widths can be used.

The I/O sub-system 650 can include one or more interfaces 662 providing a higher level of performance than flash memory interfaces 660. Each of interfaces 662A-662C can be coupled to a DMA controller 664A-664C respectively. For example, one or more of interfaces 662 can be implemented as a Universal Serial Bus (USB) type of interface. One or more of interfaces 662 can be implemented as a gigabit Ethernet type of interface. One or more of interfaces 662 can be implemented as a Secure Digital (SD) type of interface. One or more of interfaces 662 can be implemented as a PCIe interface.

The I/O sub-system 650 may also include one or more interfaces 666 such as interfaces 666A-666D that provide a lower level of performance than interfaces 662. For example, one or more of interfaces 666 can be implemented as a General Purpose I/O (GPIO) type of interface. One or more of interfaces 666 can be implemented as a Universal Asynchronous Receiver/Transmitter (UART) type of interface. One or more of interfaces 666 can be implemented in the form of a Serial Peripheral Interface (SPI) bus type of interface. One or more of interfaces 666 can be implemented in the form of a Controller-Area-Network (CAN) type of interface and/or an $I^2C$ type of interface. One or more of interfaces 666 also can be implemented in the form of a Triple Timer Counter (TTC) and/or a Watchdog Timer (WDT) type of interface.

The I/O sub-system 650 can include one or more debug interfaces 668 such as processor JTAG (PJTAG) interface 668A and a trace interface 668B. PJTAG interface 668A can provide an external debug interface for the programmable IC 602. Trace interface 668B can provide a port to receive debug, e.g., trace, information from the processing sub-system 610 or the programmable logic sub-system 630.

As shown, each of interfaces 660, 662, 666, and 668 can be coupled to a multiplexer 670. Multiplexer 670 provides a plurality of outputs that can be directly routed or coupled to external pins of the programmable IC 602, e.g., balls of the package within which the programmable IC 602 is disposed. For example, I/O pins of programmable IC 602 can be shared among interfaces 660, 662, 666, and 668. A user can configure multiplexer 670, via a configuration data stream to select which of interfaces 660-668 are to be used and, therefore, coupled to I/O pins of programmable IC 602 via multiplexer 670. The I/O sub-system 650, may also include a fabric multiplexer I/O (FMIO) interface (not shown) to connect interfaces 662-668 to programmable logic circuits of the programmable logic sub-system. Additionally or alternatively, the programmable logic sub-system 630 can be configured to implement one or more I/O circuits within programmable logic. In this example, the programmable IC 602 includes sub-system 640 having various circuits for power and/or safety management. For example, the sub-system 640 may include a power management unit 646 configured to monitor and maintain one or more voltage domains used to power the various sub-systems of the programmable IC 602. In some implementations, the power management unit 646 may disable power of individual sub-systems, when idle, to reduce power consumption, without disabling power to sub-systems in use.

The sub-system 640 may also include safety circuits to monitor the status of the sub-systems to ensure correct operation. For instance, the sub-system 640 may include one or more real-time processors 642 configured to monitor the status of the various sub-systems (e.g., as indicated in status registers 644). The real-time processors 642 may be configured to perform a number of tasks in response to detecting errors. For example, for some errors, the real-time processors 642 may generate an alert in response to detecting an error. As another example, the real-time processors 642 may reset a sub-system to attempt to restore the sub-system to correct operation. The sub-system 640 includes a switch network 648 that may be used to interconnect various sub-systems. For example, the switch network 648 may be configured to connect the various sub-systems 610, 630, and 640 to various interfaces of the I/O sub-system 650. In some applications, the switch network 648 may also be used to isolate the real-time processors 642 from the sub-systems that are to be monitored. Such isolation may be required by certain application standards (e.g., IEC-61508 SIL3 or ISO-26262 standards) to ensure that the real-time processors 642 are not affected by errors that occur in other sub-systems.

The integrated logic analyzer circuit 680 is configured to probe data of a data bus included in or connected between one or more of the sub-systems 610, 630, 640, or 650 in the programmable IC 602. In some implementations, samples of signals transmitted on the data bus may be provided to the integrated logic analyzer circuit 680 over a signal path 682 through switch 648. Additionally or alternatively, the integrated logic analyzer circuit 680 may receive samples of signals transmitted on the data bus over dedicated signal lines (not shown). The integrated logic analyzer circuit 680 may receive test data input or debug control signals and output sampled data signals via one or more communication circuits in I/O sub-system 650 such as JTAG interface 668. In some implementations, the integrated logic analyzer circuit 680 is coupled to communication circuits in I/O sub-system 650 via a signal path through switch 648. Alternatively or additionally, the integrated logic analyzer circuit 680 may be directly coupled to communication circuits in I/O sub-system 650 via a dedicated signal line (e.g., dashed signal line 684).

The disclosed methods and circuits are thought to be applicable to a variety of systems and applications. Other aspects and features will be apparent to those skilled in the art from consideration of the specification. Though aspects and features may in some cases be described in individual figures, it will be appreciated that features from one figure can be combined with features of another figure even though the combination is not explicitly shown or explicitly described as a combination. Various ones of disclosed processes and circuits may be implemented as one or more processors configured to execute software, as an application specific integrated circuit (ASIC), or as a logic on a programmable logic device. It is intended that the specification and drawings be considered as examples only, with a true scope of the invention being indicated by the following claims.

What is claimed is:

1. A method, comprising:
    capturing waveform data that describe a set of signals produced by a circuit design during operation;
    generating data structures in a memory circuit of a computer system and storing the waveform data descriptive of the signals in the data structures;
    identifying communication channels associated with the set of signals by a processor circuit of the computer system;
    identifying a plurality of protocols implemented by the identified communication channels based on metadata included in the circuit design, names of signals in the circuit design, or combinations thereof;
    identifying from the waveform data stored in the data structures, locations of a set of transaction-level events of a protocol of the identified protocols implemented by one or more of the communication channels; and
    outputting data indicating the locations in the waveform data of the set of transaction-level events.

2. The method of claim 1, further comprising, providing an extensible application program interface (API) configured to search the set of transaction-level events for a set of criteria specified by a user query.

3. The method of claim 2, further comprising, in response to a user query input via a user interface identifying, using the extensible API, portions of the set of signals that match a set of criteria specified by the user query based on the data structures.

4. The method of claim 1, wherein the identifying of the set of transaction-level events includes:
    providing application program interfaces (APIs) for the identified protocols, the APIs configured to identify transaction-level events for the protocol from the data structures for the set of signals; and
    for communication channels that implement one of the identified protocols, executing the API provided for the protocol to determine transaction-level events for the communication channels.

5. The method of claim 4, wherein the providing of the API for the protocol includes retrieving the API for the protocol from an API library.

6. The method of claim 4, wherein:
    at least one of the communication channels is associated with a plurality of signals in the set of signals; and
    the transaction-level events for the communication channel include data transactions, instructions of a program executed by a processor included in the circuit design, or combinations thereof.

7. The method of claim 4, further comprising, for at least one transaction of the identified transactions, tracing the one transaction across an interface between two of the communication channels that implement different ones of the identified protocols, wherein the tracing of the at least one transaction is performed based on metadata in the circuit design.

8. The method of claim 1, wherein:
    for at least one communication channel, the transaction-level events determined for the communication channel include a first set of transactions for a first protocol; and further comprising, identifying a second set of transactions for a second protocol from the first set of transactions, wherein the second protocol is a higher-level protocol in comparison to the first protocol.

9. The method of claim 8, wherein the second protocol is configured for communication of video frames, networking packets, or CPU instructions.

10. The method of claim 1, further comprising:
determining a set of performance metrics for a plurality of circuit modules in the circuit design, based on the set of transaction-level events; and
displaying the set of performance metrics for the circuit modules via a user interface.

11. The method of claim 10, wherein the set of performance metrics includes latency, timing slack, power consumption, signal jitter, throughput, data transfer size, or combinations thereof.

12. The method of claim 10, further comprising for at least one performance metric determining a minimum, a maximum and an average value of the performance metric over a time period specified by a user.

13. The method of claim 1, further comprising displaying in a graphical user interface (GUI) window:
graphical representations of waveforms for the set of signals;
visual markers identifying the transaction-level events in the waveforms; and
visual markers identifying location and type of one or more detected protocol violations.

14. The method of claim 1, further comprising simulating operation of the circuit design.

15. The method of claim 1, further comprising:
configuring programmable resources of a programmable integrated circuit (IC) to implement the circuit design; and
using an integrated logic analyzer on the programmable IC, capturing the waveform data and communicating the waveform data to the computer system.

16. An apparatus, comprising a computing arrangement including:
one or more processor circuits; and
a memory circuit coupled to the one or more processor circuits and storing a set of instructions configured to, when executed by the processor circuits, cause the processor circuit to perform operations including:
capture waveform data that describe a set of signals produced by a circuit design during operation and storing the waveform data in the memory circuit;
generate data structures and storing the waveform data descriptive of the signals in the data structures;
identify communication channels associated with the set of signals;
identify a plurality of protocols implemented by the identified communication channels based on metadata included in the circuit design, names of signals in the circuit design, or combinations thereof;
identify from the waveform data stored in the data structures, locations of a set of transaction-level events of a protocol of the identified protocols implemented by one or more of the communication channels; and
store in the memory circuit, data indicative of the locations of the set of transaction-level events in the waveform data.

17. The apparatus of claim 16, further comprising:
a programmable integrated circuit (IC) communicatively coupled to the computing arrangement; and
wherein the set of instructions further cause the one or more processor circuits to, program programmable resources of the programmable IC to implement the circuit design.

18. The apparatus of claim 16, wherein the identifying the set of transaction-level events by the one or more processor circuits for the communication channel includes:
providing application program interfaces (APIs) for the identified protocols, the APIs configured to identify transaction-level events for the protocol from the data structures for the set of signals; and
for communication channels that implement one of the identified protocols, executing the API provided for the protocol to determine transaction-level events for the communication channels.

19. The apparatus of claim 16, wherein the set of instructions further cause the processor to determine a set of performance metrics for the circuit design based on the identified transaction-level events, the set of performance metrics including latency, timing slack, power consumption, signal jitter, throughput, data transfer size, or combinations thereof.

20. The apparatus of claim 16, wherein the set of instructions further cause the processor to:
provide a user interface; and
in response to a user query input via the user interface:
identify portions of the set of signals that match a set of criteria specified by the user query based on the data structures, and
using the user interface, displaying graphical representations of the identified portions.

* * * * *